US011749634B2

(12) United States Patent
Maruyama et al.

(10) Patent No.: US 11,749,634 B2
(45) Date of Patent: Sep. 5, 2023

(54) SEMICONDUCTOR DEVICE AND WIRE BONDING METHOD

(71) Applicant: Kioxia Corporation, Tokyo (JP)

(72) Inventors: Kazuya Maruyama, Higashikurume (JP); Tsutomu Sano, Yokohama (JP); Junichi Saijo, Suzuka (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/142,363

(22) Filed: Jan. 6, 2021

(65) Prior Publication Data

US 2021/0210457 A1  Jul. 8, 2021

(30) Foreign Application Priority Data

Jan. 7, 2020 (JP) .................... 2020-000795

(51) Int. Cl.
  *H01L 23/00* (2006.01)
  *H01L 25/065* (2023.01)
(52) U.S. Cl.
  CPC .............. *H01L 24/45* (2013.01); *H01L 24/48* (2013.01); *H01L 24/85* (2013.01); *H01L 25/0652* (2013.01); *H01L 2224/45032* (2013.01); *H01L 2224/45124* (2013.01); *H01L 2224/45139* (2013.01); *H01L 2224/45144* (2013.01); *H01L 2224/45147* (2013.01); *H01L 2224/45164* (2013.01); *H01L 2224/48472* (2013.01); *H01L 2224/85205* (2013.01); *H01L 2225/06506* (2013.01); *H01L 2225/06562* (2013.01); *H01L 2225/06582* (2013.01)

(58) Field of Classification Search
  CPC ......... H01L 24/45; H01L 24/48; H01L 24/85; H01L 25/0652; H01L 224/45032; H01L 224/45124; H01L 224/45139; H01L 224/45144; H01L 224/45147; H01L 224/45164; H01L 224/48472
  See application file for complete search history.

(56) References Cited

U.S. PATENT DOCUMENTS

| | | | |
|---|---|---|---|
| 8,742,258 B2 | 6/2014 | Terashima et al. | |
| 2007/0222042 A1* | 9/2007 | Lee | ........................ H01L 24/45 |
| | | | 257/666 |
| 2012/0146204 A1* | 6/2012 | Lee | ........................ H01L 24/45 |
| | | | 257/676 |
| 2013/0099393 A1 | 4/2013 | Jeong et al. | |
| 2017/0338164 A1* | 11/2017 | Koerner | ................ H01L 23/293 |

(Continued)

FOREIGN PATENT DOCUMENTS

| CN | 109950219 A | 6/2019 |
|---|---|---|
| JP | 57-12543 A | 1/1982 |
| JP | 7-221140 A | 8/1995 |

(Continued)

*Primary Examiner* — Marc Anthony Armand
(74) *Attorney, Agent, or Firm* — Oblon, McClelland, Maier & Neustadt, L.L.P.

(57) ABSTRACT

According to one embodiment, a semiconductor device includes a first electrode, a second electrode, and a wire extending between the first electrode and the second electrode. The wire includes a first conductor in contact with the first electrode and the second electrode, and a second conductor that is provided inside the first conductor and has no contact with the first electrode and the second electrode.

13 Claims, 8 Drawing Sheets

(56) References Cited

U.S. PATENT DOCUMENTS

2020/0350273 A1* 11/2020 Antoku .................. H01L 24/48

FOREIGN PATENT DOCUMENTS

| JP | 2010-245574 A | 10/2010 |
| JP | 5088981 B1 | 12/2012 |
| JP | 5497360 B2 | 5/2014 |
| JP | 2019-114575 A | 7/2019 |
| SG | 191711 A1 | 8/2013 |
| TW | 201306224 A1 | 2/2013 |
| TW | 201342541 A | 10/2013 |

* cited by examiner

SEMICONDUCTOR DEVICE AND WIRE BONDING METHOD

CROSS-REFERENCE TO RELATED APPLICATIONS

This application is based upon and claims the benefit of priority from Japanese Patent Application No. 2020-000795, filed Jan. 7, 2020, the entire contents of which are incorporated herein by reference.

FIELD

Embodiments described herein relate generally to a semiconductor device and a wire bonding method.

BACKGROUND

Wire bonding has been known as a technique of electrically coupling electrodes.

DETAILED DESCRIPTION

Figure 1:
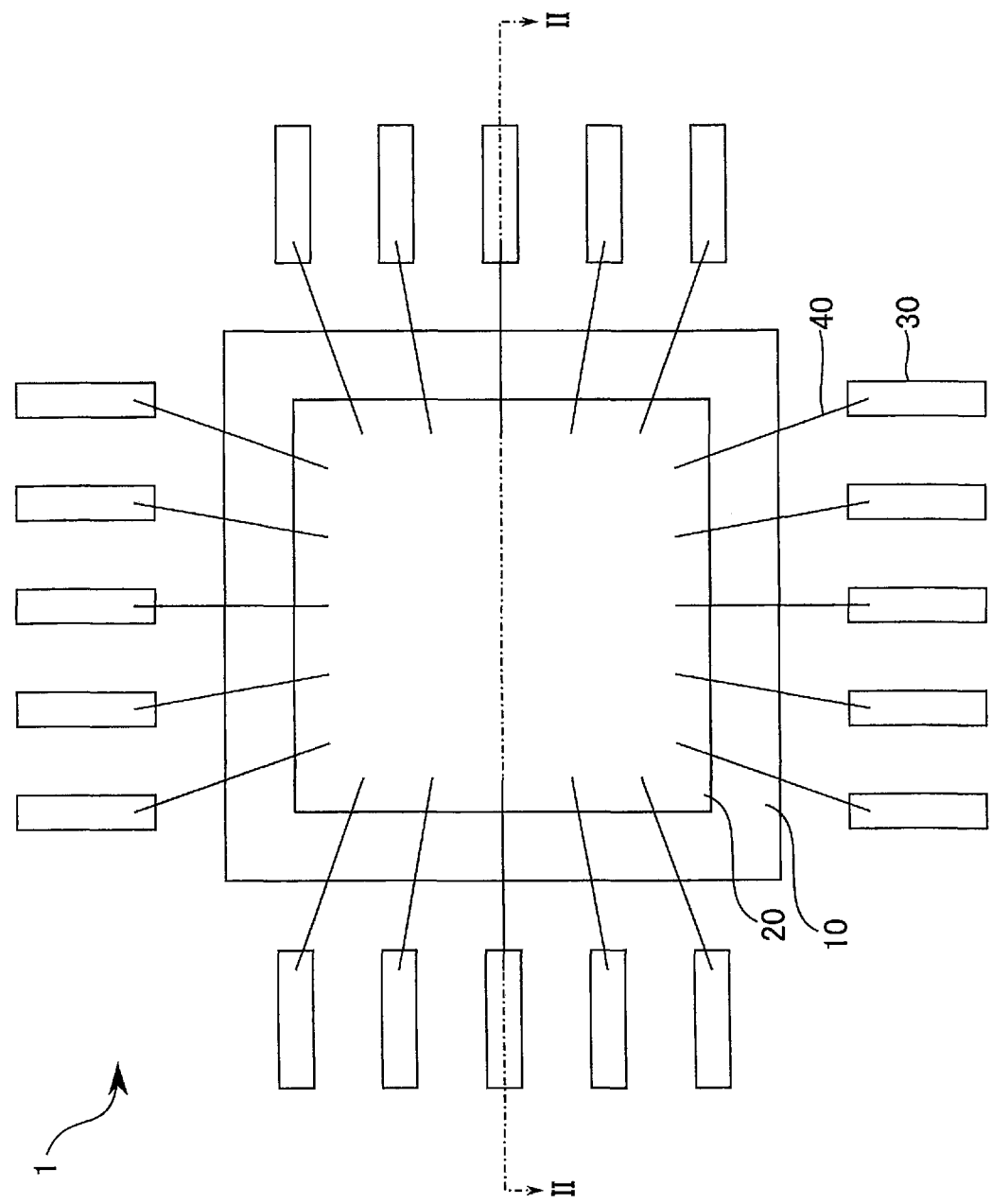
FIG. 1 is a top view showing an overall configuration of a semiconductor device according to an embodiment.

In general, according to one embodiment, a semiconductor device includes a first electrode, a second electrode, and a wire extending between the first electrode and the second electrode. The wire includes a first conductor in contact with the first electrode and the second electrode, and a second conductor that is provided inside the first conductor and has no contact with the first electrode and the second electrode.

Hereinafter, embodiments will be described with reference to the accompanying drawings. Each of the embodiments is an example of an apparatus and a method to embody a technical idea of the invention. The drawings are schematic or conceptual, and the dimensions and ratios, etc. in the drawings are not always the same as the actual ones. The technical ideas of the present invention are not limited by shapes, structures, or arrangements, etc. of the structural elements.

In the following description, a "diameter" of a substance means an average outer diameter of the substance in a cross section perpendicular to the direction in which the substance extends.

1. Embodiment

A semiconductor device according to an embodiment is described.

1.1 Configuration

First, a configuration of the semiconductor device according to the embodiment will be described.

1.1.1 Semiconductor Device

FIG. 1 is a top view showing a configuration of the semiconductor device according to the embodiment. For convenience of explanation, FIG. 1 omits an insulator that covers the semiconductor device.

As shown in FIG. 1, a semiconductor device 1 includes a semiconductor substrate 10, a semiconductor chip 20, a plurality of lead terminals 30, and a plurality of wires 40. The semiconductor chip 20 is stacked on the semiconductor substrate 10. In the following description, a direction in which the semiconductor chip 20 is stacked on the semiconductor substrate 10 is defined as an "upward direction". Specifically, the semiconductor chip 20 is formed on an upper surface of the semiconductor substrate 10.

The semiconductor chip 20 is electrically coupled to each of the lead terminals 30 with the corresponding wires 40 interposed therebetween. This enables the semiconductor chip 20 to communicate, for purposes of exchanging information, with an outside of the semiconductor device 1, and to receive power supply therefrom via the plurality of lead terminals 30.

As an example of the semiconductor device 1, FIG. 1 illustrates a Quad Flat Non-leaded package (QFN) to be used in a vehicle-mounted device, a mobile deice, etc. For example, the semiconductor device 1 may be one of the plurality of semiconductor devices formed on the semiconductor substrate 10. In such a case, the lead terminals 30 need not be those formed on a lead frame, and can be those formed on any of the other semiconductor devices on the semiconductor substrate 10.

Figure 2:
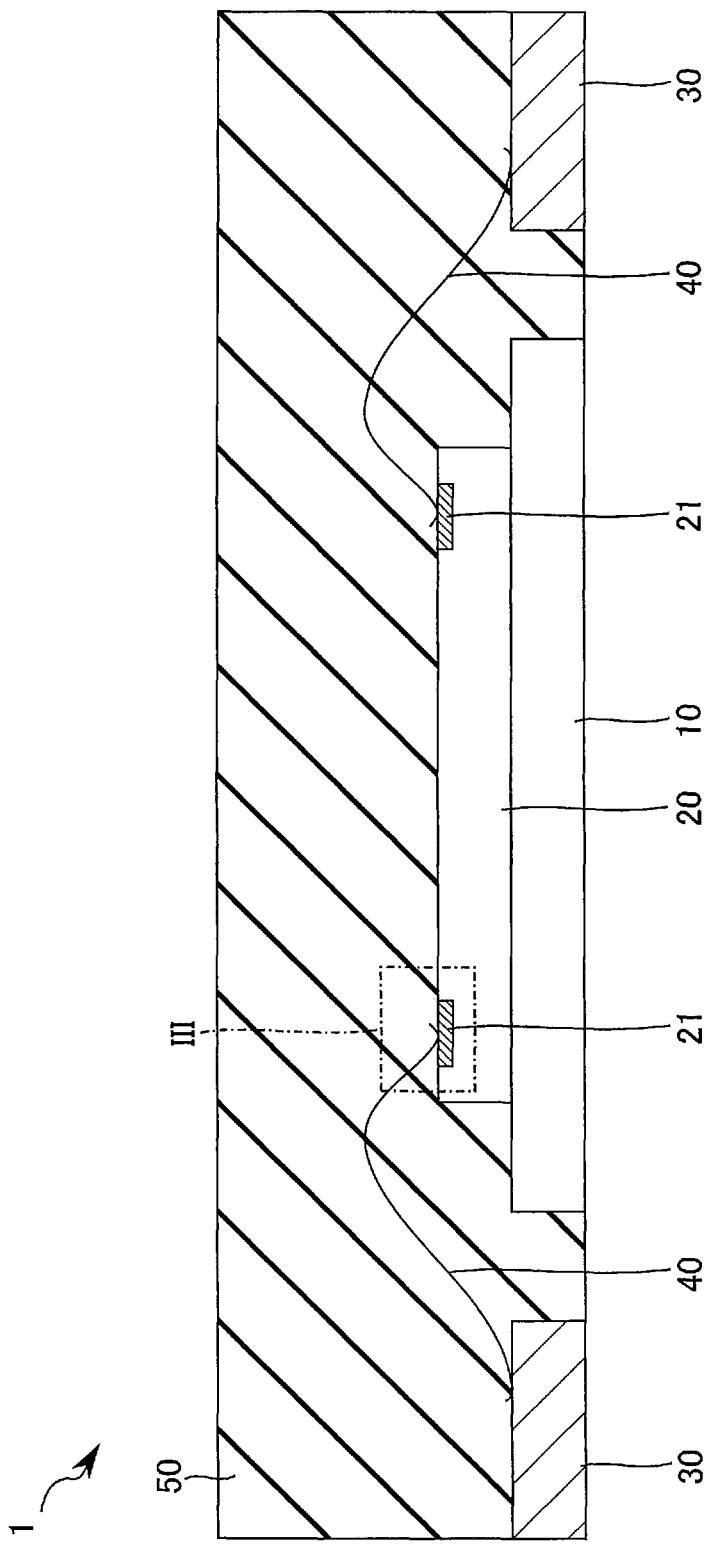
FIG. 2 is a cross-sectional view of the semiconductor device taken in line II-II shown in FIG. 1.

FIG. 2 is a cross-sectional view of the semiconductor device 1 cut along line II-II shown in FIG. 1.

As shown in FIG. 2, the semiconductor substrate 10, the semiconductor chip 20, the plurality of lead terminals 30, and the plurality of wires 40 are sealed with an insulator 50.

A plurality of pad electrodes 21 are formed on an upper surface of the semiconductor chip 20. For example, the pad electrodes 21 are formed in such a manner that one pad electrode corresponds to one lead terminal 30 and is physically and electrically coupled thereto with at least one wire 40 interposed therebetween. Specifically, the wire 40 is a conductor including a first end bonded to the corresponding pad electrode 21, and a second end bonded to the corresponding lead terminal 30.

1.1.2 Details of Junction

Figure 3:
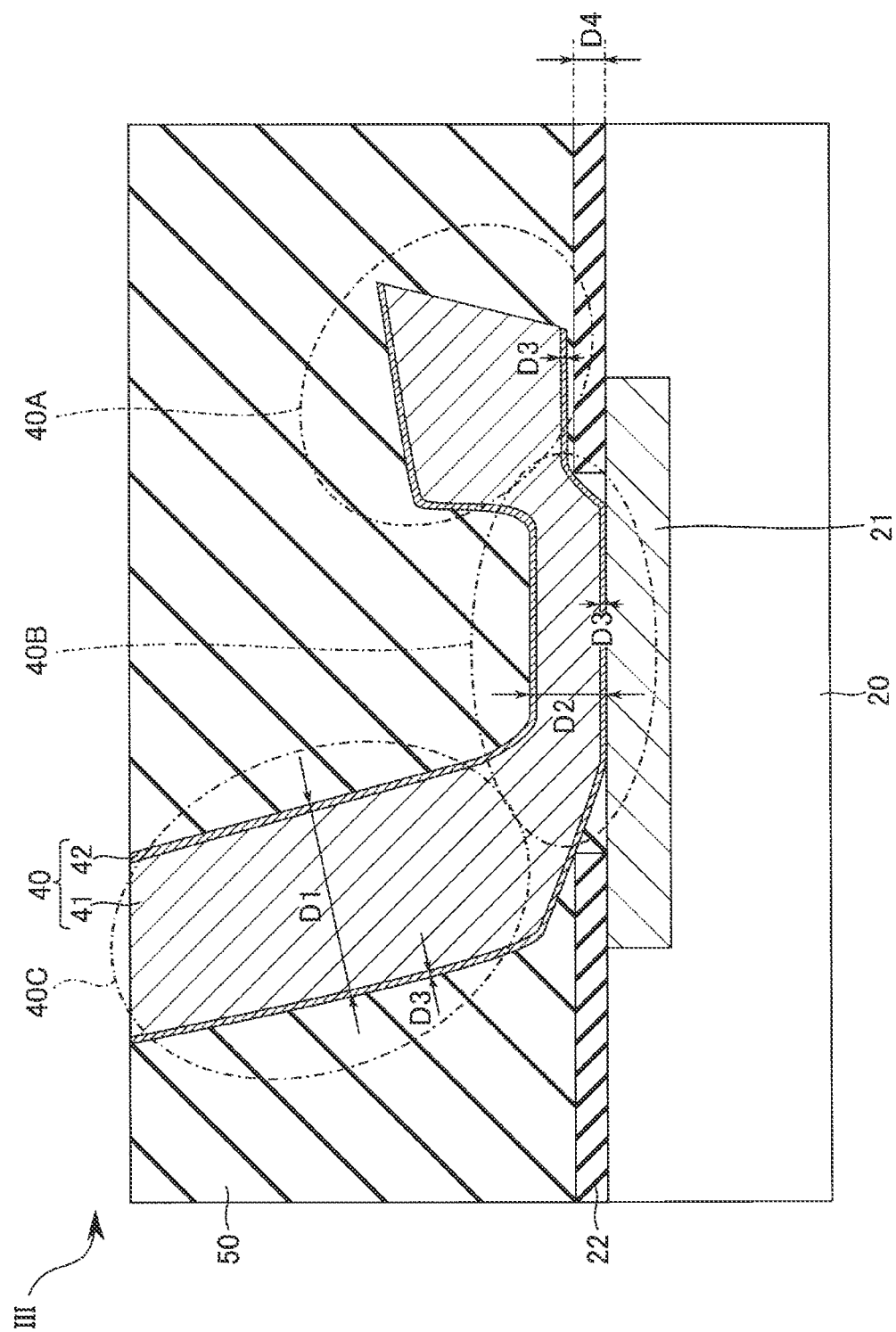
FIG. 3 is a cross-sectional view of the semiconductor device and shows an enlarged view of a region III in FIG. 2.

FIG. 3 is a cross-sectional view of the semiconductor device 1 and shows an enlarged view of region III in FIG. 2. FIG. 3 mainly illustrates details of a junction between the pad electrode 21 and the first end of the wire 40.

As shown in FIG. 3, the upper surface of the semiconductor chip 20 contains a region in which the pad electrode 21 is not formed. For example, an insulator 22 containing polyimide is formed on this region. The insulator 22 has, for example, a thickness D4. With this, the pad electrode 21 is designed to have its upper surface positioned below the upper surface of the insulator 22 by the thickness D4.

The wire 40 includes a core member 41 and a coating member 42.

The core member 41 is a conductor containing at least one metal selected from, for example, copper (Cu), gold (Au), silver (Ag), and aluminum (Al), and functions as a communication path between each pad electrode 21 and each lead terminal 30.

The coating member 42 is, for example, a conductor containing palladium (Pd), and is configured to cover the periphery of the core member 41, thereby preventing the core member 41 from coming into contact with the outside of the wire 40 (in particular, the pad electrode 21). Therefore, the coating member 42 corresponds to a portion of the wire 40, which is in contact with the outside of the wire 40, and the core member 41 is not in contact with (separated from) the outside of the wire 40 except for a cut section of the wire 40. A thickness D3 of the coating member 42 is, for example, smaller than diameters D1 and D2 of the core member 41.

The first end of the wire 40 includes a portion 40A having the cut section, a portion 40C extending toward the lead terminal 30, and a portion 40B formed between the portions 40A and 40C and having a bonding surface bonded to the pad electrode 21. The portion 40B of the first end of the wire 40 has the diameter D2 which is, for example, smaller than the diameter D1 of the portion 40C. More specifically, the diameter D2 may set to the range, for example, from ⅕ to ½ of the diameter D1 (D1×⅕≤D2≤D1×½). Furthermore, for example, the diameter D2 is set to be greater than the thickness D4 of the insulator 22 (D2>D4).

Herein, the diameter D1 may take on any given number, and is set to an appropriate number depending on the use of the semiconductor device 1. For example, in a case where the semiconductor device 1 is a power semiconductor that consumes relatively large power, the diameter D1 may be designed to fall within the range from 100 micrometers (μm) to 500 micrometers (μm). Furthermore, in a case where the semiconductor device 1 is a semiconductor device which consumes relatively small power, such as a flash memory, an integrated circuit, a discrete semiconductor, or a light emitting diode (LED), the diameter D1 may be designed to fall within the range from 15 micrometers (μm) to 80 micrometers (μm).

In the portion 40B of the first end of the wire 40, a region containing the bonding surface bonded to the pad electrode 21 exhibits uniform the diameter D2. In other words, the first end of the wire 40 has an upper surface in the portion 40B, which is substantially parallel to the upper surface of the pad electrode 21.

In the bonding surface between the wire 40 and the pad electrode 21, the pad electrode 21 is in contact with the coating member 42. In this bonding surface, the presence of the coating member 42 between the core member 41 and the pad electrode 21 prevents contact therebetween.

As described above, the wire 40 is configured in such a manner that the core member 41 and the coating member 42 are distinguishable from each other in the portion 40B bonded to the pad electrode 21. This configuration is realized by wedge bonding in which the wire is pressure-bonded to the pad electrode, thereby being bonded thereto without melting the first end of the wire, and not by ball bonding in which the first end of the wire melted into a ball form is bonded to the pad electrode.

Although specific illustration is omitted, the aforementioned wedge bonding is applied to a bonding portion bonded to the lead terminal 30, in the second end of the wire 40. In this manner, the coating member 42, also in the bonding portion bonded to the lead terminal 30, is bonded to the lead terminal 30 just as it is to the pad electrode 21 shown in FIG. 3; however, the core member 41 is not in contact with the lead terminal 30.

1.2 Manufacturing Method

Figure 4:
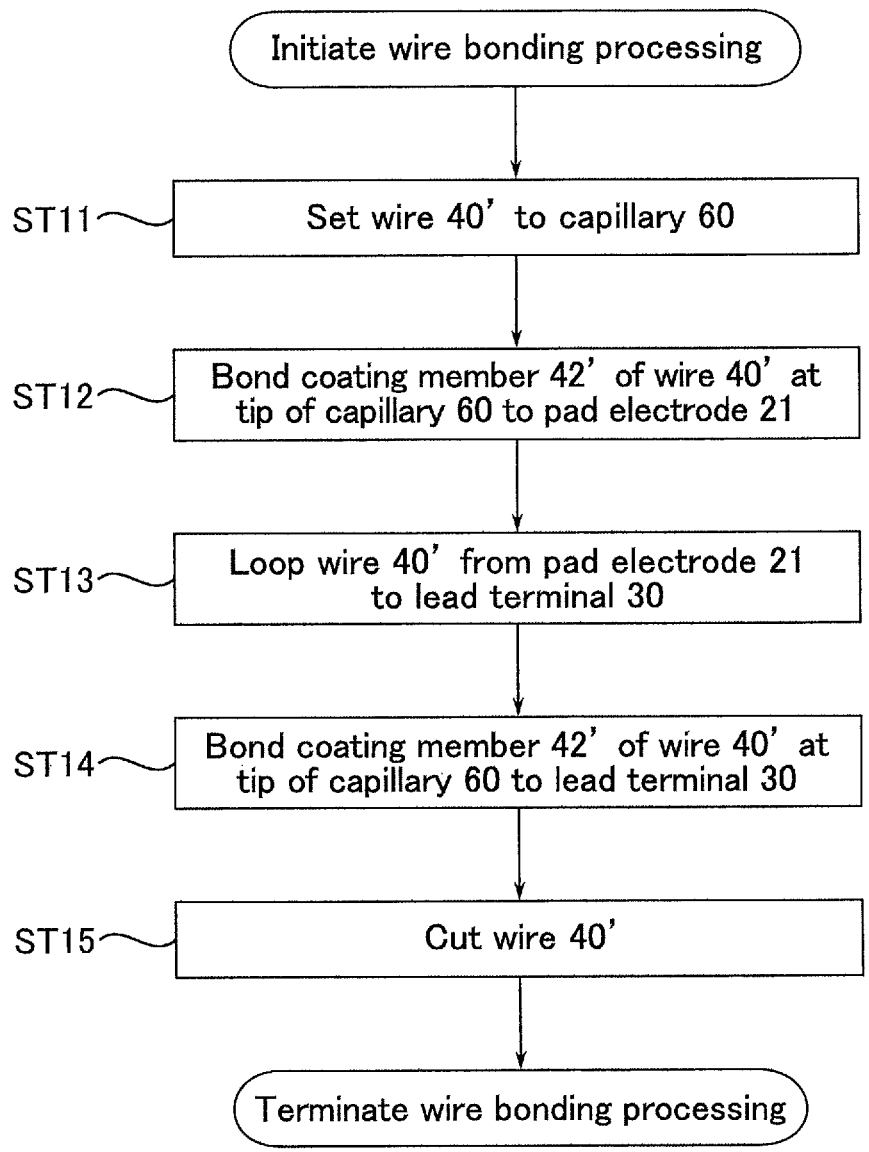
FIG. 4 is a flowchart illustrating wire bonding processing in a process for manufacturing the semiconductor device according to the embodiment.
Figure 5:
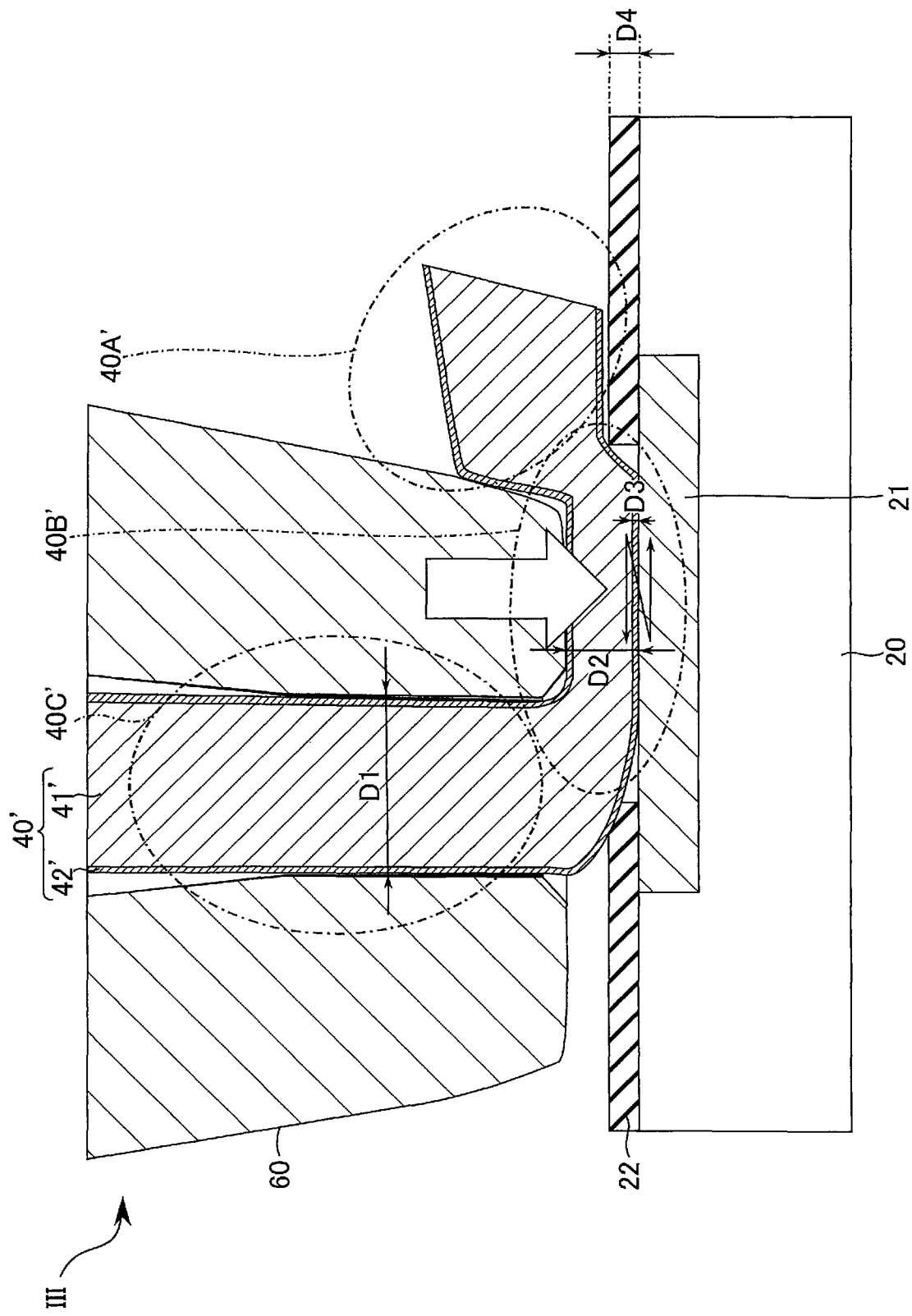
FIG. 5 is a cross-sectional view schematically illustrating a portion corresponding to the wire bonding processing in the process for manufacturing the semiconductor device according to the embodiment.

In the process of manufacturing the semiconductor device according to the embodiment, an example of wire bonding processing between the pad electrodes will be described below. FIG. 4 is a flowchart for illustrating wire bonding processing for the semiconductor device according to the embodiment. FIG. 5 is a cross-sectional view for schematically illustrating wire bonding processing shown in FIG. 4; in particular, wire bonding processing with respect to the pad electrode 21.

The wire bonding processing for the semiconductor device according to the embodiment is, for example, wedge bonding processing using a bonding device (not shown) capable of executing ball bonding processing. In the configuration included in the bonding device, a capillary that functions as an interface between the wire and the pad is illustrated as a capillary 60 in FIG. 4 and FIG. 5. A wire that is set to the capillary 60 and serves as a material for the wire 40 is illustrated as a wire 40' including a core member 41' and a coating member 42' coating the core member 41' in FIG. 4 and FIG. 5.

First, a flow for wire bonding processing will be described with reference to FIG. 4.

As shown in FIG. 4, the wire 40' is set to the capillary 60 in step ST11. Specifically, for example, the wire 40' is set to a state in which it extends through the capillary 60 and protrudes by a predetermined length from the tip of the capillary 60.

In step ST12, the bonding device controls the capillary 60, thereby bonding the coating member 42' of the wire 40' at the tip of the capillary 60 to the pad electrode 21. To be more specific, for example, the bonding device presses the wire 40' at the tip of the capillary 60 against the pad electrode 21 while applying ultrasonic oscillation. Accordingly, in the wire 40' pressed against the pad electrode 21, the core member 41' is plastically deformed while the coating member 42' is bonded to the pad electrode 21.

In step ST13, the bonding device moves the capillary 60 from an upper position of the pad electrode 21 to an upper position of the lead terminal 30 while unreeling the wire 40' from the tip of the capillary 60. In this manner, in the wire 40', a portion between the portion bonded to the pad electrode 21 and the tip of the capillary 60 is looped between the pad electrode 21 and the lead terminal 30.

In step ST14, the bonding device controls the capillary 60, thereby bonding the coating member 42' of the wire 40' at the tip of the capillary 60 to the lead terminal 30. To be more specific, for example, the bonding device presses the wire 40' at the tip of the capillary 60 against the lead terminal 30 while applying ultrasonic oscillation. By this, in the wire 40' pressed against the lead terminal 30, plastic deformation occurs mainly in the core member 41' while the coating member 42' is bonded to the lead terminal 30.

In step ST15, the bonding device controls the capillary 60, thereby cutting the wire 40' in a position between the portion bonded to the lead terminal 30 and the tip of the capillary 60. This results in the formation of the wire 40 having the first end bonded to the pad electrode 21 and the second end bonded to the lead terminal 30.

The wire bonding processing is thus completed.

Next, states of the capillary 60, the wire 40', and the pad electrodes 21 in step ST12 in the flow shown in FIG. 4 will be described with reference to FIG. 5.

As shown in FIG. 5, at a time when the wire 40' is bonded to the pad electrode 21, the wire 40' includes: a portion 40A' that is positioned outside the capillary 60 in an upper position of the insulator 22 and includes a cut surface; a portion 40B' sandwiched between the tip of the capillary 60 and the pad electrode 21; and a portion 40C' housed in the capillary 60. As described above, the portion 40B' of the wire 40' is bonded to the pad electrode 21 by means of pressure from the capillary 60 and ultrasonic oscillation. By adjusting the pressure and the ultrasonic oscillation to predetermined values when performing bonding, deformation occurs to the extent that the diameter D2 in the portion 40B' of the wire 40' ranges from ½ to ⅕ of the diameter D1 in the portion 40C' of the wire 40'. However, the coating member 42', without being cut, keeps its thickness D3 almost constant. In this manner, the portion 40B' of the wire 40' is bonded to the pad electrode 21 with the coating member 42' interposed therebetween without bringing the core member 41' into direct contact with the pad electrode 21.

A portion of the capillary 60, in which the wire 40' is pressed against the pad electrode 21, has a surface substantially parallel to the upper surface of the pad electrode 21. For this reason, the portion 40B' of the wire 40' receives a uniform pressure across the bonding surface bonded to the pad electrode 21, thereby having the uniform thickness D2.

The manufacturing steps described in the above serve merely an example. The manufacturing steps may have any process inserted therebetween, or may be interchanged as long as no problem arises.

1.3 Advantageous Effect of Present Embodiment

According to the present embodiment, the wire 40 is bonded to the pad electrode 21 and the lead terminal 30 by means of wedge bonding. In other words, ball bonding is not adopted for bonding of the wire 40 to the pad electrode 21 and the lead terminal 30. Accordingly, the wire 40 can be bonded to the pad electrode 21 without melting in a ball form. This enables, in the portion 40B bonded to the pad electrode 21, the coating member 42 to be in contact with the pad electrode 21 while being separated from the core member 41, and the core member 41 to be formed away from the pad electrode 21 and the outside of the wire 40. This produces an improvement in reliability of bonding between the wire 40 and the pad electrode 21.

As an additional note, a metal contained in the core member 41 may corrode due to a substance which is present outside the wire 40, such as chlorine (Cl) or sulfur (S); however, the coating member 42 may adopt, as a metal contained therein, a metal substance having a higher resistance to corrosion due to the aforementioned substance than that of the core member 41. This allows the coating member 42 to protect the core member 41 from corrosion due to the aforementioned substance. According to the present embodiment, the core member 41, at a time of bonding to the portion 40B, does not melt into a ball form, and therefore does not become mixed with the coating member 42. This realizes the bonding to the pad electrode 21 while keeping the possibility of the core member 41 coming into contact with the outside of the wire 40 lower than that of ball bonding. This prevents the metal contained in the core member 41 from corroding due to a substance outside the wire 40. Therefore, deteriorating reliability of bonding between the wire 40 and the pad electrode 21 can be prevented due to the aforementioned corrosion.

As another additional note, a metal contained in the core member 41 may come into contact with aluminum (Al) contained in the pad electrode 21, thereby forming an alloy layer with the aluminum (Al). Such an alloy layer is not preferable because it may lead to deteriorating reliability of bonding between the wire 40 and the pad electrode 21. According to the present embodiment, the core member 41, at a time of bonding to the portion 40B, does not melt into a ball form, and therefore does not become mixed with the coating member 42. This realizes the bonding to the pad electrode 21 while keeping the possibility of the core member 41 coming into contact with the pad electrode 21 lower than that of ball bonding. This prevents the metal contained in the core member 41 from forming an alloy layer with the pad electrode 21. Therefore, deteriorating reliability of bonding between the wire 40 and the pad electrode 21 can be prevented due to the aforementioned corrosion.

The wire bonding processing according to the present embodiment is executable using a ball bonder capable of executing ball bonding. In this manner, the wire bonding processing is applicable to a wire having a relatively small diameter (ranging from, e.g., 15 micrometers (μm) to 80 micrometers (μm)), to which a wedge bonder is not applicable. Therefore, the wire bonding processing according to the present embodiment is applicable not only to the manufacture of a power semiconductor using a wire with a relatively large diameter, but also to the manufacture of a semiconductor device such as a flash member, using a wire with a relatively small diameter.

1.4 Modification

The above embodiment can be variously modified.

The above embodiment assumes that the wire 40 is wedge-bonded at the two points including the first end and the second end of the wire 40. However, this is not a limitation. For example, a wire may be wedge-bonded at the first end and the second end of one wire, and additionally, on at least one more portion between the first end and the second end. Hereinafter, the description for the same configurations and operations as those of the above embodiment will be omitted, and those differing from those of the above embodiment will be mainly described.

1.4.1 Configuration of Semiconductor Device

Figure 6:
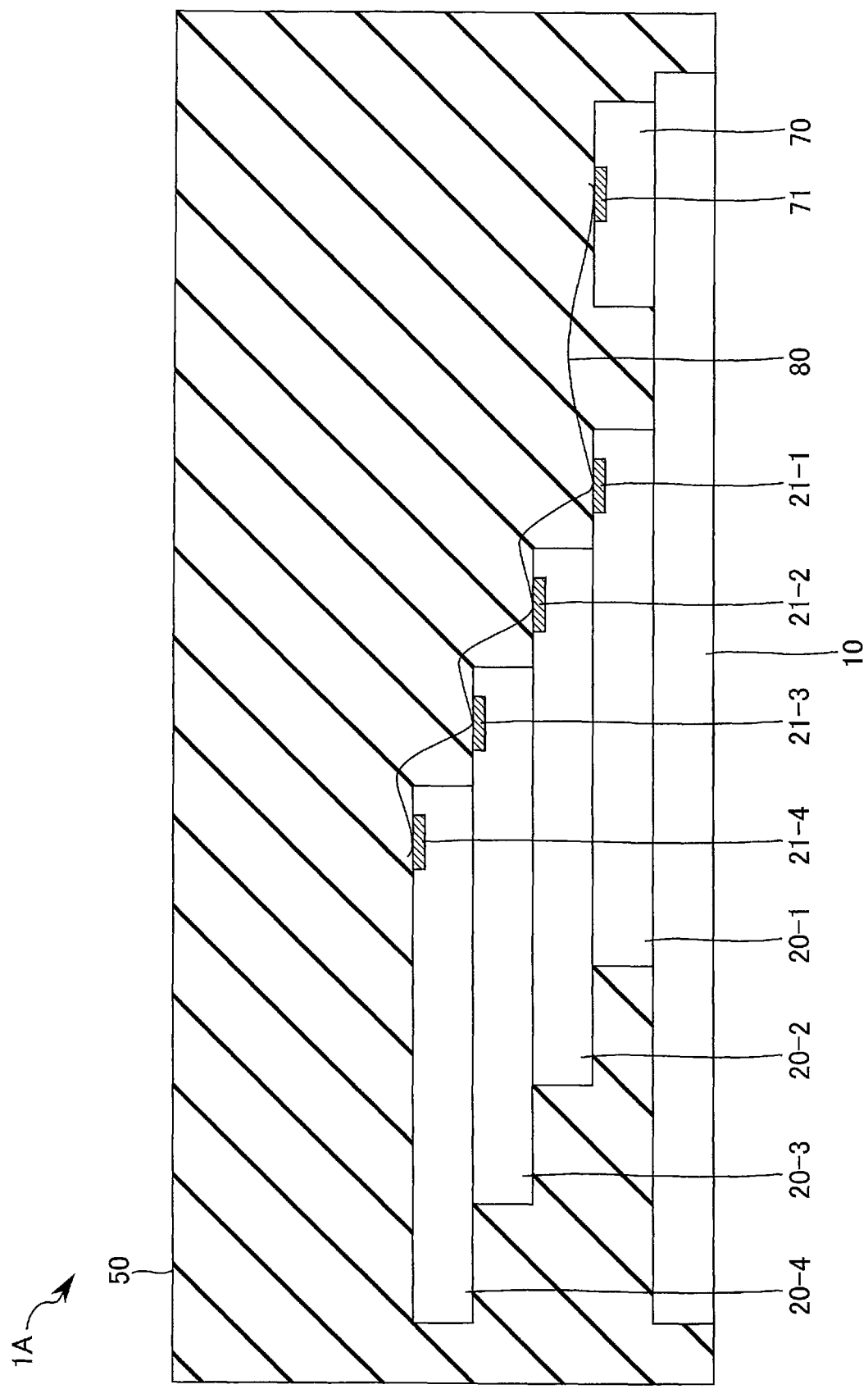
FIG. 6 is a cross-sectional view of a semiconductor device according to a modification.

FIG. 6 is a cross-sectional view of a semiconductor device according to a modification.

As shown in FIG. 6, a semiconductor device 1A includes the semiconductor substrate 10, a plurality of semiconductor chips 20-1, 20-2, 20-3, 20-4, and 70, and at least one wire 80. Although the illustration is omitted in FIG. 6, the semiconductor device 1A may further include lead terminals such as those illustrated in FIG. 2, and each of the chips within the semiconductor device 1A may be bonded to the lead terminals via a wire (not shown) in a manner such as that described in the first embodiment.

The semiconductor chip 20-1 is formed on an upper surface of the semiconductor substrate 10. The semiconductor chip 20-2 is formed on an upper surface of the semiconductor chip 20-1. The semiconductor chip 20-3 is formed on an upper surface of the semiconductor chip 20-2. The semiconductor chip 20-4 is formed on an upper surface of the semiconductor chip 20-3. For example, the semiconductor chips 20-1 to 20-4 are equivalent in size and performance. Two adjacent semiconductor chips in the semiconductor chips 20-1 to 20-4 are stacked by being shifted from each other in such a manner that a part of the upper surface of the lower semiconductor chip is prevented from being in contact with a lower surface of the upper semiconductor chip. In the upper surface of the lower semiconductor chip, a region which is not in contact with the lower surface of the upper semiconductor chip will be referred to as a "terraced region" hereinafter.

The semiconductor chip 20-1 has a pad electrode 21-1 in its terraced region. The semiconductor chip 20-2 has a pad electrode 21-2 in its terraced region. The semiconductor chip 20-3 has a pad electrode 21-3 in its terraced region. The semiconductor chip 20-4 has a pad electrode 21-4 in its terraced region.

A semiconductor chip 70 is formed on the upper surface of the semiconductor substrate 10 in a similar manner to the semiconductor chip 20-1. A pad electrode 71 is formed on an upper surface of the semiconductor chip 70.

The plurality of semiconductor chips 20-1 to 20-4 and 70 configured on the semiconductor substrate 10 are physically and electrically coupled to each other via at least one wire 80. In the example shown in FIG. 6, the wire 80 has a first end coupled by wedge bonding to the pad electrode 21-4, and a second end coupled by wedge bonding to the pad electrode 71. Furthermore, the wire 80 is bonded by wedge bonding to the pad electrode 21-2 in a position between the first end and the second end, to the pad electrode 21-3 between the first end and the bonding portion bonded to the pad electrode 21-2, and to the pad electrode 21-1 in a position between the second end and the pad electrode 21-2.

The wire 80 has a configuration equivalent to that of the wire 40 according to the embodiment. Specifically, the wire 80 includes a core member 81 and a coating member 82. The core member 81 is a conductor containing at least one metal selected from, for example, copper (Cu), gold (Au), silver (Ag), and aluminum (Al), and functions as a communication path between the pad electrodes 21-1 to 21-4 and 71.

The coating member 82 is, for example, a conductor containing palladium (Pd), and is configured to cover the periphery of the core member 81 to prevent the core member 81 from coming into contact with the outside of the wire 80. Therefore, in the wire 80, a portion in contact with the outside of the wire 80 corresponds to the coating member 82, and the core member 81 is not in contact with (separated from) the outside of the wire 80 except for a cut section of the wire 80.

Each of the configurations on the semiconductor substrate 10 described above is sealed with the insulator 50.

1.4.2 Manufacturing Method of Semiconductor Device

Figure 7:
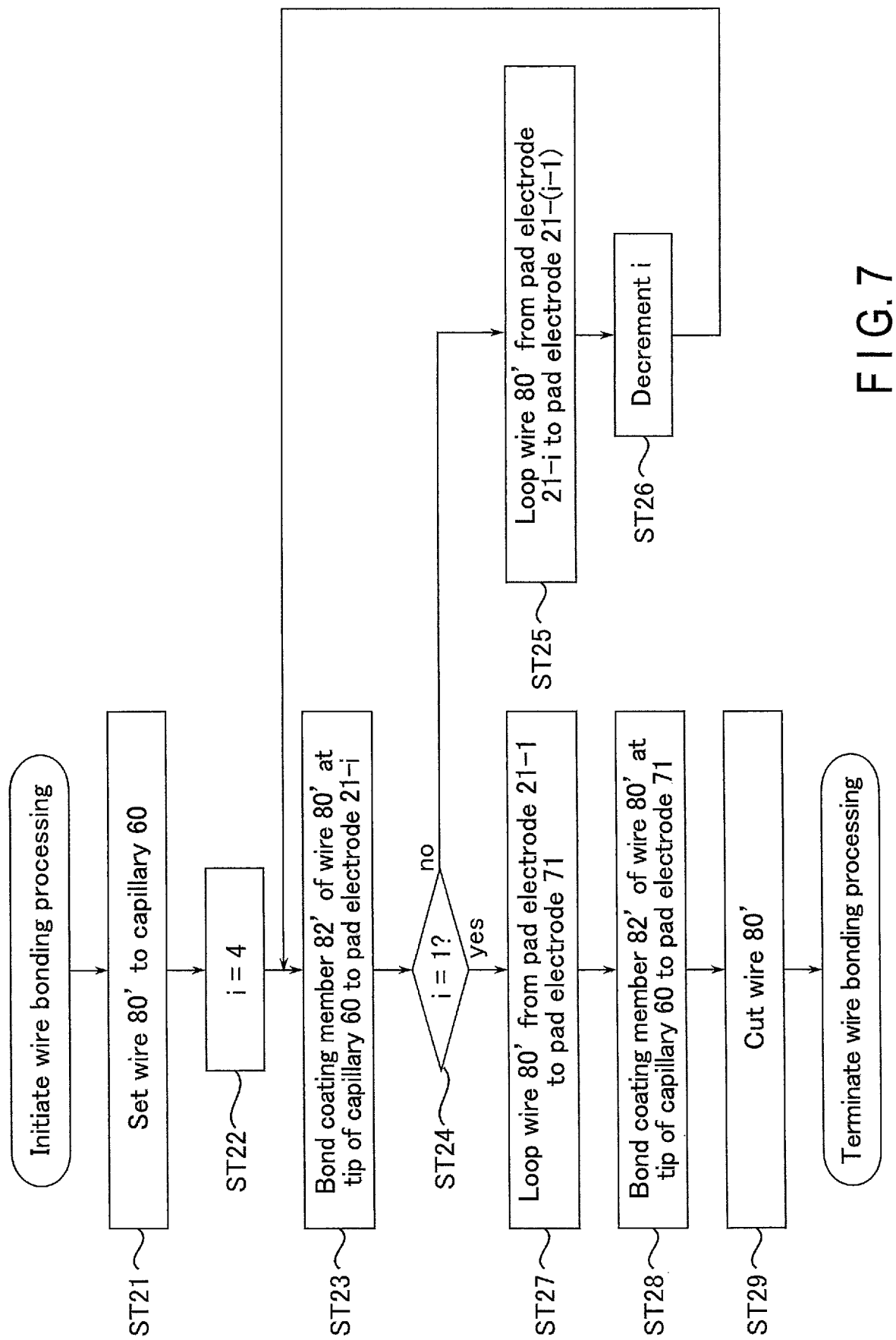
FIG. 7 is a flow chart illustrating wire bonding processing in a process for manufacturing the semiconductor device according to the modification.

FIG. 7 is a flowchart for illustrating wire bonding processing for the semiconductor device according to the modification. A wire that is set to the capillary 60 and serves as a material for the wire 80 is illustrated as a wire 80' including a core member 81' and a coating member 82' coating the core member 81' in FIG. 7.

As shown in FIG. 7, the wire 80' is set to the capillary 60 in step ST21.

In step ST22, the bonding device sets variable i to "4". This variable i corresponds to the pad electrode 21-i illustrated in FIG. 6 and is appropriately settable to any given number.

In step ST23, the bonding device controls the capillary 60, thereby bonding the coating member 82' of the wire 80' at the tip of the capillary 60 to the pad electrode 21-i (that is, the pad electrode 21-4).

In step ST24, the bonding device determines whether or not the variable i is equal to "1". If the variable i is not equal to "1" (step ST24: No), the processing proceeds to step ST25. If the variable i is equal to "1" (step ST24; Yes), the processing proceeds to step ST27.

In step ST25, the bonding device moves the capillary 60 from an upper position of the pad electrode 21-i to an upper position of the pad electrode 21-(i−1) while unreeling the wire 80' from the tip of the capillary 60. In this manner, in the wire 80', a portion between the portion bonded to the pad electrode 21-i and the tip of the capillary 60 is looped between the pad electrode 21-i and the pad electrode 21-(i−1).

In step ST26, the bonding device decrements the variable i, and thereafter, the processing returns to step ST23. In this manner, the processing of bonding the wire 80' to the pad electrode 21-i is repeated while decrementing the variable i until step ST24 determines that the variable i is equal to "1".

In step ST27, the bonding device moves the capillary 60 from an upper position of the pad electrode 21-1 to an upper position of the pad electrode 71 while unreeling the wire 80' from the tip of the capillary 60. In this manner, in the wire 80', a portion between the portion bonded to the pad electrode 21-1 and the tip of the capillary 60 is looped between the pad electrode 21-1 and the pad electrode 71.

In step ST28, the bonding device controls the capillary 60, thereby bonding the coating member 82' of the wire 80' at the tip of the capillary 60 to the pad electrode 71.

In step ST29, the bonding device controls the capillary 60, thereby cutting the wire 80' in a position between the portion bonded to the pad electrode 71 and the tip of the capillary 60. This results in the formation of the wire 80 bonded by wedge bonding to each of the pad electrode 21-1 to 21-4 and 71.

The wire bonding processing is thus completed.

1.4.3 Advantageous Effects of Present Modification

According to the present modification, the wire 80 is bonded to the pad electrode 21-4 at the first end, to the pad electrode 71 at the second end, and further to the pad electrodes 21-1 to 21-3 in a position between the first end and the second end. All of the bonding portions bonded to the pad electrodes 21-1 to 21-4 and 71 are formed by wedge bonding. In this manner, all of the pad electrodes 21-1 to 21-4 and 71 are in contact with the coating member 82, without having contact with the core member 81. Accordingly, advantageous effects similar to those of the above embodiment can be produced, and three or more pad electrodes, i.e., the pad electrodes 21-1 to 21-4 and 71 can be electrically coupled to each other via the single wire 80.

1.4.4 Application Example

Figure 8:
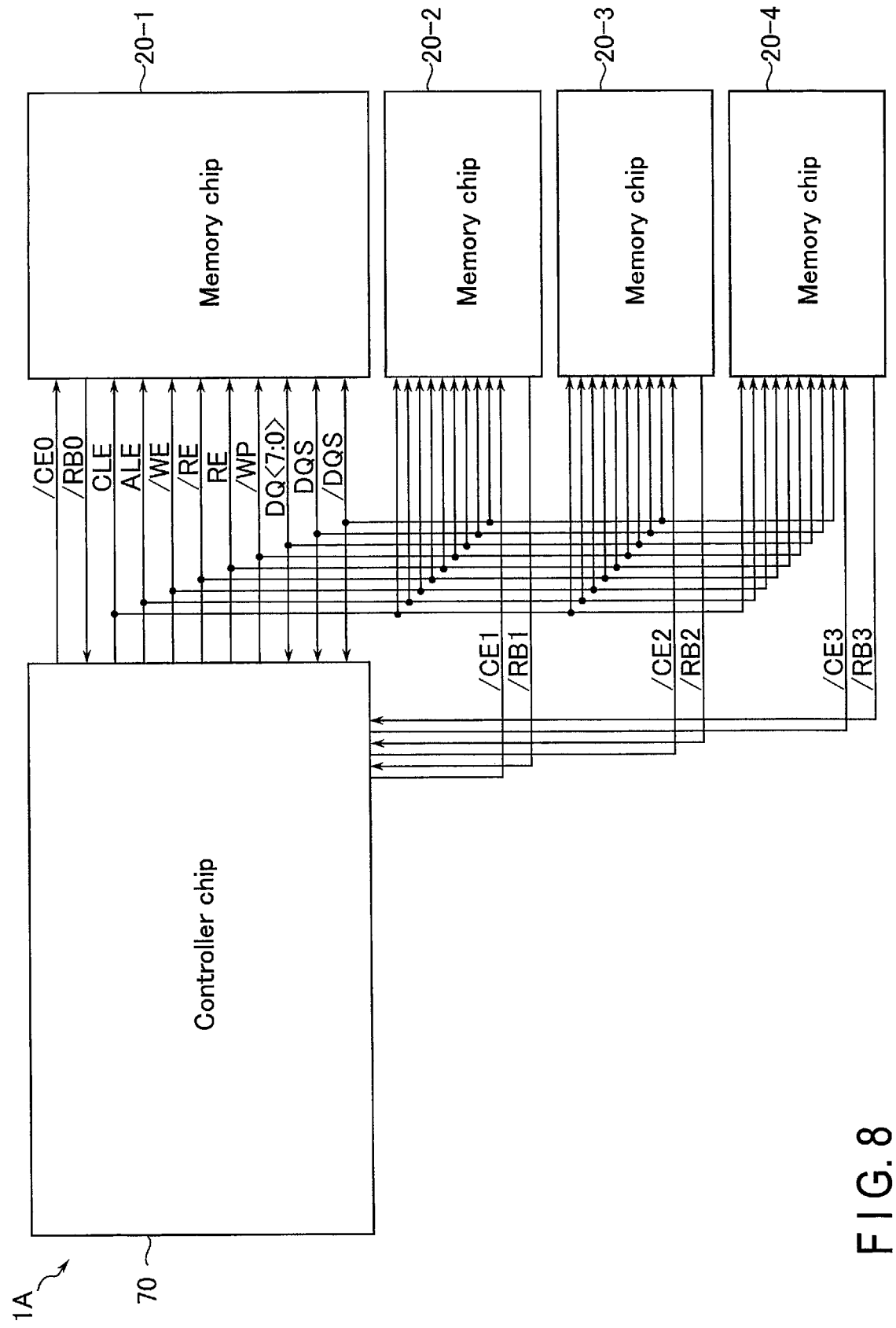
FIG. 8 is a block diagram of a semiconductor device according to an application example.

FIG. 8 shows an application example of the embodiment and the modification described above.

FIG. 8 is a block diagram showing a configuration of a semiconductor device according to an application example. FIG. 8 shows, as an application example of the modification, a memory system including a plurality of memory chips corresponding to the semiconductor chips 20-1 to 20-4, and a controller chip corresponding to the semiconductor chip 70. The memory system corresponds to the semiconductor device 1A shown in FIG. 6.

As shown in FIG. 8, the controller chip 70 controls the memory chips 20-1 to 20-4. Specifically, the controller chip 70 writes data in the memory chip 20-1 to 20-4 and reads data therefrom. The controller chip 70 is coupled to the memory chips 20-1 to 20-4 via a NAND bus.

Each of the memory chips 20-1 to 20-4 includes a plurality of memory cells and stores data in a non-volatile manner. The memory chips 20-1 to 20-4 are each a semiconductor chip uniquely identifiable from a chip address assigned in advance, and are configured to be operable independently or in synchronization with each other as per instructions from the controller chip 70.

On the NAND bus connected to each of the memory chips 20-1 to 20-4, signals of the same type are transmitted and received. The NAND bus includes a plurality of signals lines, and transmits and receives signals /CE0 to /CE3, CLE, ALE, /WE, RE, /RE, /WP, /RB0 to /RB3, DQ<7:0>, DQS, and /DQS in accordance with a NAND interface. The signals CLE, ALE, /WE, RE, /RE, and /WP are received by the memory chips 20-1 to 20-4, and the signals /RB0 to /RB3 are received by the controller chip 70. The signals /CE0 to /CE3 are respectively received by the memory chips 20-1 to 20-4.

The signals /CE0 to /CE3 are signals to enable the memory chips 20-1 to 20-4, respectively. The signal CLE notifies the memory chips 20-1 to 20-4 that the signal DQ<7:0> flowing into the memory chips 20-1 to 20-4 when the signal CLE is at "H (high)" level is a command. The signal ALE notifies the memory chips 20-1 to 20-4 that the signal DQ<7:0> flowing into the memory chips 20-1 to 20-4 when the signal ALE is at "H" level is an address. The signal /WE instructs the memory chips 20-1 to 20-4 to take therein the signal DQ<7:0> flowing into the memory chips 20-1 to 20-4 when the signal /WE is at the "L (low)" level. The signals RE and /RE instruct the memory chips 20-1 to 20-4 to output the signal DQ<7:0>, and are used for, for example, controlling operation timing of the memory chips 20-1 to 20-4 when outputting the signal DQ<7:0>. The signal /WP prohibits the memory chips 20-1 to 20-4 from writing and erasing data. Each of the signals /RB0 to /RB3 indicates whether the memory chips 20-1 to 20-4 is in a ready state (a state of accepting external instructions) or in a busy state (a state of not accepting external instructions). The signal DQ<7:0> is, for example, an eight-bit signal. The signal DQ<7:0> is an entity of data transmitted and received between the memory chips 20-1 to 20-4 and the controller chip 70, and includes a command, an address, and data. The signals DQS and /DQS can be generated based on, for example, the signals RE and /RE, and are used for controlling operation timing of the memory chips 20-1 to 20-4 according to the signal DQ<7:0>.

In the application example described above, signal lines for the signals CLE, ALE, /WE, RE, /WP, DQ<7:0>, DQS, and /DQS can be realized by the wire 40 according to the embodiment because all of the memory chips 20-1 to 20-4 and the controller chip 70 are coupled in common to these signal lines. Signal lines for the other signals, the signals /CE0 to /CE3 and /RB0 to /RB3, are realized by the wire 80 according to the modification because they couple the memory chips 20-1 to 20-4 to the controller chip 70.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor device comprising:
    a first electrode;
    a second electrode;
    a wire extending between the first electrode and the second electrode; and
    an insulator configured to seal the first electrode, the second electrode, and the wire,
    wherein the wire includes:
        a first conductor in contact with the first electrode and the second electrode;
        a second conductor that is provided inside the first conductor, has no contact with the first electrode and the second electrode, and is different from the first conductor;
        a first portion in contact with the first electrode;
        a second portion in contact with the second electrode;
        a third portion between a first side of the first portion and the second portion; and
        a fourth portion in a second side of the first portion different from the first side, wherein
        the first portion of the wire and the second portion of the wire have diameters ranging from ⅕ to ½ of a diameter of the third portion of the wire,
        the first conductor and the second conductor are in contact with the insulator in the fourth portion, and
        a thickness of the first conductor is constant over the fourth portion, the first portion, the third portion, and the second portion.

2. The device of claim 1, further comprising a semiconductor chip having an upper surface provided with the first electrode.

3. The device of claim 2, wherein the first conductor contains palladium (Pd).

4. The device of claim 3, wherein the second conductor contains at least one metal selected from copper (Cu), gold (Au), silver (Ag), and aluminum (Al).

5. The device of claim 4, wherein the wire has a diameter ranging from 15 micrometers (μm) to 80 micrometers (μm).

6. The device of claim 5, wherein the semiconductor chip is one of a memory device, an integrated circuit, a discrete semiconductor, and a light emitting diode (LED).

7. The device of claim 4, wherein the wire has a diameter ranging from 100 micrometers (μm) to 500 micrometers (μm).

8. The device of claim 7, wherein the semiconductor chip is a power semiconductor.

9. A wire bonding method comprising:
    setting a wire including a first conductor and a second conductor inside the first conductor to a capillary, the second conductor being different from the first conductor;
    bonding the first conductor in a first portion of the wire to a first electrode without bringing the second conductor into contact with the first electrode by wedge bonding;
    looping the wire from the first electrode to a second electrode;
    bonding the first conductor in a second portion of the wire to the second electrode without bringing the second conductor into contact with the second electrode by the wedge bonding; and
    cutting off the first portion of the wire, the second portion of the wire, and a third portion between the first portion of the wire and the second portion of the wire from a fourth portion of the wire inside the capillary, wherein
    the first portion of the wire and the second portion of the wire have dimeters ranging from ⅕ to ½ of a diameter of the third portion of the wire,
    the first conductor and the second conductor are exposed when cutting off the first portion, the second portion, and the third portion from the fourth portion, and
    a thickness of the first conductor is constant over the fourth portion, the first portion, the third portion, and the second portion.

10. The method of claim 9, wherein the first conductor contains palladium (Pd).

11. The method of claim 10, wherein the second conductor contains at least one metal selected from copper (Cu), gold (Au), silver (Ag), and aluminum (Al).

12. The method of claim 11, wherein the wire has a diameter ranging from 15 micrometers (μm) to 80 micrometers (μm).

13. The method of claim 11, wherein the wire has a diameter ranging from 100 micrometers (μm) to 500 micrometers (μm).

\* \* \* \* \*